United States Patent
Cho et al.

(10) Patent No.: US 6,835,682 B2
(45) Date of Patent: Dec. 28, 2004

(54) HIGH THERMAL EXPANSION GLASS AND TAPE COMPOSITION

(75) Inventors: Yong Cho, Apex, NC (US); Kenneth Warren Hang, Hillsborough, NC (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 128 days.

(21) Appl. No.: 10/390,108

(22) Filed: Mar. 17, 2003

(65) Prior Publication Data

US 2003/0224923 A1 Dec. 4, 2003

Related U.S. Application Data

(60) Provisional application No. 60/385,701, filed on Jun. 4, 2002.

(51) Int. Cl.$^7$ .......................... C03C 14/00; C03C 3/064
(52) U.S. Cl. ............................. 501/32; 501/20; 501/77; 428/434
(58) Field of Search ............................. 501/20, 32, 77; 428/434

(56) References Cited

U.S. PATENT DOCUMENTS

| | | | |
|---|---|---|---|
| 4,256,796 A | | 3/1981 | Hang et al. ................. 428/210 |
| 4,358,541 A | | 11/1982 | Andrus et al. ................. 501/5 |
| 4,385,127 A | | 5/1983 | Chyung .......................... 501/5 |
| 4,830,988 A | * | 5/1989 | Hang et al. .................... 501/21 |
| 5,002,903 A | | 3/1991 | Lim et al. ...................... 501/26 |
| 5,958,807 A | * | 9/1999 | Kumar et al. ................... 501/5 |
| 6,017,642 A | * | 1/2000 | Kumar et al. ................ 428/630 |
| 6,589,894 B1 | * | 7/2003 | Mito et al. ..................... 501/17 |

FOREIGN PATENT DOCUMENTS

| | | |
|---|---|---|
| JP | 60-172102 | 9/1985 |
| JP | 10-245263 | 9/1998 |

OTHER PUBLICATIONS

Masahiko Higashi, et al., Improvement of Solder Joint Reliability between Multilayer Ceramic Package and Printed Wiring Board, (1999), pp. 127–131, no month.

Yong S. Cho, et al., LTCC Ceramic Components on Printed Wiring Boards—The Issue and Potential Solutions, 2000 International Symposium on Microelectronics, pp. 665–668, no month.

* cited by examiner

Primary Examiner—Karl Group

(57) ABSTRACT

The present invention relates to an alkali-containing magnesium borosilicate glass composition comprising, in mole %, 10–25% $SiO_2$, 10–25% $B_2O_3$, 5–10% BaO, 40–65% MgO, 0.5–3% $ZrO_2$, 0.3–3% $P_2O_5$, and 0.2-5% $M_2O$ where M is selected from the group of alkali elements and mixtures thereof. The invention is further directed to a castable dielectric composition comprising a dispersion of finely divided solids comprising, based on solids: (a) 50–90 wt. % the glass composition as described above; (b) 10–50 wt. % ceramic filler; both dispersed in a solution of (c) an organic polymeric binder; and (d) a volatile organic solvent. The invention is still further directed to the castable dielectric composition described above used in a method of forming a high TCE LTCC green tape by casting a thin layer of the castable dispersion onto a flexible substrate and heating the cast layer to remove the volatile organic.

17 Claims, No Drawings

HIGH THERMAL EXPANSION GLASS AND TAPE COMPOSITION

FIELD OF THE INVENTION

The invention is directed to high thermal expansion glass compositions for use in castable tape compositions to fabricate multilayer circuits for the ball grid array (BGA) application.

BACKGROUND OF THE INVENTION

Recent packaging technologies concerning ceramic materials have demanded a higher packing density, better performance, and a lower cost. The low temperature co-fired ceramic tape (LTCC) technology has been regarded as a key solution, which can meet all of these requirements. LTCC is a well-known technology for combining high conducting metallization (silver and gold) with reliable ceramic dielectric layers for dense packaging of IC circuits. Generally, LTCC substrate consists of glass and ceramic. Glass allows a low temperature firing below 900° C., while ceramic (as a filler) gives high mechanical strength and dimensional stability as a result of certain interactions with glass. In most cases, the design of glass is more important than the choice of ceramic materials particularly when specific functions are required. The selection of glass determines compatibility of the resultant substrates with other contacting materials such as conductors and passive devices.

The LTCC materials have been carefully designed also for the BGA applications, where PWB materials having a high TCE (Temperature Coefficient of Expansion) of 12–20 ppm° $C.^{-1}$ are integrated with LTCC materials via solder joints. As a potential solution to achieve a better integrity between the dissimilar materials, a new ceramic substrate having a high TCE above 9 ppm° $C.^{-1}$ has been demanded. The high TCE LTCC can reduce thermal stress at the solder joints, leading to better thermal cycle behavior without substantial cracking or electrical failures.

The present invention fills such a need by providing new glass compositions which exhibit high thermal expansion. The resultant glass-ceramic body after firing exhibits good strength and silver compatibility. In addition, the new glasses allow for low temperature firing, i.e., below the melting point of silver which broadens the processing latitude of present day systems.

SUMMARY OF THE INVENTION

The present invention relates to an alkali-containing magnesium borosilicate glass composition comprising, in mole %, 10–25% $SiO_2$, 10–25% $B_2O_3$, 5–10% BaO, 40–65% MgO, 0.5–3% $ZrO_2$, 0.3–3% $P_2O_5$, and 0.2–5% $M_2O$ where M is selected from the group of alkali elements and mixtures thereof. The preferred alkali elements are Li, Na and K.

The invention is further directed to a castable dielectric composition comprising a dispersion of finely divided solids comprising, based on solids: (a) 50–90 wt. % the glass composition as described above; (b) 10–50 wt. % ceramic filler; both dispersed in a solution of (c) an organic polymeric binder; and (d) a volatile organic solvent.

The invention is still further directed to the castable dielectric composition described above used in a method of forming a high TCE LTCC green tape by casting a thin layer of the castable dispersion onto a flexible substrate and heating the cast layer to remove the volatile organic solvent.

DETAILED DESCRIPTION OF THE INVENTION

Circuit materials that make up the glasses and ceramic tapes of this invention are free of elements, such as Pb and Cd, which are on the EPA hazardous waste list. This invention is based on the finding that ceramic tapes exhibiting high TCE can be made by combining alkali-containing magnesium borosilicate glasses with ceramic fillers.

Glass

Novel magnesium borosilicate glasses, which exhibit a high TCE are disclosed herein. The phrase "high TCE" is defined as a high temperature coefficient of expansion of above 9 ppm/° C. in the temperature range of 25° C. to 300° C.

The alkali-containing magnesium borosilicate glasses of this invention are novel and differ from common borosilicate glasses in that ceramics prepared by the glass of the present invention with or without a filler have high TCE values. The components of the glass are based on mole %, 10–25% $SiO_2$, 10–25% $B_2O_3$, 5–10% BaO, 40–65% MgO, 0.5–3% $ZrO_2$, 0.3–3% $P_2O_5$, and 0.2–5% alkali elements, for example, Li, Na and K. The large content of magnesium in glass is believed to provide a high TCE value. Depending on the content of magnesium oxide in glass, the TCE value varies. In particular, the existence of alkali oxides improves sensitivity of the glass to heating condition by controlling the densification and crystallization behavior of the resulting tapes. The crucial role of the alkali addition is to provide required flow and densification characteristics to the tape at its desired firing temperature. The lithium addition to the glass provides an effective means to onset sintering and complete crystallization of the matrix glass at the required thermal processing conditions. It performs the function of glass viscosity reduction without affecting required physical and electrical performance of the tape. The magnesium borosilicate glasses used in the castable dielectric compositions of the present invention may contain several other oxide components, e.g., $ZrO_2$, BaO, and $P_2O_5$.

The glasses described herein a produced by conventional glass making techniques. The glasses were prepared in 500–1000 gram quantities. Typically, the ingredients are weighted then mixed in the desired proportions and heated in a bottom-loading furnace to form a melt in platinum alloy crucibles. As well known in the art, heating is conducted to a peak temperature (1400–1600° C.) and for a time such that the melt becomes entirely liquid and homogeneous. The glass melts were then quenched by counter rotating stainless steel roller to form a 10–20 mil thick platelet of glass. The resulting glass platelet was then milled to form a powder with its 50% volume distribution set between 1–5 microns. The glass powders were then formulated with filler and medium as detailed below.

The glass described herein is also compatible with co-fired silver conductors. The glass does not flow excessively on firing. This eliminates mixing with the silver and allows solder wetting. Solder wetting is an important feature to allow connection of the ceramic circuit to external wiring such as on a printed circuit board.

Green Tape Composition

The green tape composition is a castable dielectric composition which forms a tape. The glass from above is one component of the composition. It forms a glass-ceramic structure during firing by forming crystalline phases, which lead to a high TCE and a sufficient mechanical strength. However, ceramic oxide filler such as $Al_2O_3$, $ZrO_2$, $TiO_2$, $BaTiO_3$ and mixtures thereof is typically added to the castable dielectric composition in an amount of 10–50 wt. % based on solids. The filler controls physical, thermal and electrical properties of the tape over the given temperature and frequency range.

$Al_2O_3$ is the chosen ceramic filler since it may partially react with the glass to form an Al-containing crystalline phase or modify the sintering behavior of tape. $Al_2O_3$ is very effective in providing high mechanical strength and inertness against detrimental chemical reactions. Another function of the ceramic filler is Theological control of the system during firing. The ceramic particles limit flow of the glass by acting as a physical barrier. They also inhibit sintering of the glass and thus facilitate better burnout of the organics. Other fillers, a quartz, $CaZrO_3$, mullite, cordierite, forsterite, zircon, zirconia, yttria or calcia-stabilized zirconia, $CaTiO_3$, $MgTiO_3$, $SiO_2$, and amorphous silica may be used by themselves or in mixtures to modify tape performance and characteristics.

In the formulation of tape compositions, the amount of glass relative to the amount of ceramic material is quite important. The ceramic filler range of 15–30% by wt. based on solids is considered preferable in that the sufficient densification and conductor compatibility are achieved. Typically, if the filler concentration exceeds 50% by wt., the fired structure is not sufficiently densified and too porous. Within a desirable glass/filler ratio, it will be apparent that, during firing, the liquid glass will become saturated with filler material.

For the purpose of obtaining higher densification of the composition upon firing, it is important that the inorganic solids have small particle sizes. In particular, substantially none of the particles should exceed 15 $\mu$m and preferably not exceed 10 $\mu$m. Subject to these maximum size limitations, it is preferred that at least 50% of the particles, both glass and ceramic, be greater than 1 $\mu$m and preferably in the 2–5 $\mu$m range.

In addition to the filler, a coloring agent such as $Cu_2O$, $CuO$, $Fe_2O_3$, and $CoO$ may be added to help the compatibility of the tape with silver-based conductors. The incorporation of $CuO$ in the glass prevents significant silver diffusion from the printed conductor pattern into the tape. The identical ionic charge of $Cu^{+1}$ with $Ag^{+1}$ is believed to contribute to the prevention against the Ag diffusion. The combination of two coloring agents may be advantageous. For example, the small contents of $Cu_2O$, $Fe_2O_3$ or mixtures thereof to the castable composition were very effective in reducing possible Ag diffusion and staining problems.

The organic medium in which the glass and ceramic inorganic solids are dispersed is comprised of the polymeric binder which is dissolved in a volatile organic solvent and, optionally, other dissolved materials such as plasticizers, release agents, dispersing agents, stripping agents, antifoaming agents and wetting agents.

To obtain better binding efficiency, it is preferred to use at least 5% wt. polymer binder for 90% wt. solids, which includes glass and ceramic filler, based on total composition. However, it is further preferred to use no more than 20% wt. polymer binder in 80% wt. solids based on total composition. Within these limits, it is desirable to use the least possible amount of binder vis-à-vis solids in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly (vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacyrlic acid have been previously used as binders for slip casting materials.

U.S. Pat. No. 4,536,535 to Usala issued Aug. 20, 1985 has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the polymers permit the use of minimum amounts of binder and maximum amounts of solids, their use is preferred with the dielectric composition of this invention. For this reason, the disclosure of the above referred Usala application is incorporated by reference herein.

Frequently, the polymeric binder will also contain a small amount, relative to the binder polymer, of a plasticizer which serves to lower the glass transition temperature (Tg) of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1, 3-monoisobutyrate, toluene, methylene chloride and fluorocarbons. It will be recognized that individual components of the solvent may not be complete solvents for the binder polymer. Yet, when blended with other solvent components, they function as solvents.

A particularly preferred solvent is ethyl acetate since it avoids the use of environmentally hazardous chlorocarbons.

In addition to the solvent and polymer, a plasticizer is used to impart workability in cutting laminating. A preferred plasticizer is BENZOFLEX® 400 which is a polypropylene glycol dibenzoate.

Application

A green tape is formed by casting a thin layer of a slurry dispersion of the glass, filler, polymeric binder and solvent as described above onto a flexible substrate, heating the cast layer to remove the volatile solvent and then separating the solvent-free layer from the substrate. The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching.

However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace or in a box furnace with a programmed heating cycle forming a fired article.

As used herein, the term "firing" means heating the article in an oxidizing atmosphere, for example air, to a temperature and for a time sufficient to volatilize (burn-out) the organic material in the layers of the assemblage to sinter any glass, metal or dielectric material in the layers and thus densify the dielectric layer. For the LTCC applications, the firing usually happens below 900° C. within a relative short heating profile of less than 4 hours.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

The present invention will be described in further detail by giving practical examples. The scope of the present invention, however, is not limited in any way by these practical examples.

EXAMPLES

Examples 1–14

A series of high thermal expansion magnesium borosilicate glasses containing alkali oxides were prepared as seen in the glass compositions of Table 1. Oxides and carbonates of each glass components were used as raw materials. All glasses were processed by mixing the raw materials and then firing in a platinum crucible at 1550° C. The melt was mixed and quenched into water. It was dry-milled in the presence of a small amount of isopropanol to prevent powder compaction and then hot air dried. The average particle size of the resultant glass frit was targeted below 6 µm.

In Examples 9–12 the $Li_2O$ content in glass was changed. The glass melt was homogeneous regardless of the $Li_2O$ content. According to thermal differential analysis, the different levels of $Li_2O$ addition have modified significantly the densification and crystallization behavior. The high $Li_2O$ content resulted in lowering crystallization temperature as demonstrated in the following table.

| Glass # | $Li_2O$ content in glass (mole %) | Crystallization peak temperature |
|---|---|---|
| Example 1 | 0.5 | 776° C. |
| Example 10 | 1.6 | 772° C. |
| Example 11 | 2.7 | 765° C. |
| Example 12 | 3.8 | 755° C. |

The control of the densification and crystallization by the $Li_2O$ content is very useful in the LTCC application requiring a rigid substrate below 900° C.

Although the addition of $Na_2O$ and $K_2O$ in Example 13 and 14 did not bring significant impact on the densification and crystallization as $Li_2O$ did, the alkali addition has been regarded as a crucial factor in controlling overall performance of the resulting high TCE ceramic substrate.

TABLE 1

| | Glass composition in mole % | | | | | | | | | | | | | |
|---|---|---|---|---|---|---|---|---|---|---|---|---|---|---|
| Ex # | 1 | 2 | 3 | 4 | 5 | 6 | 7 | 8 | 9 | 10 | 11 | 12 | 13 | 14 |
| $SiO_2$ | 15 | 22.2 | 13.5 | 14.5 | 17.7 | 17.7 | 13.5 | 11.8 | 14.4 | 14.5 | 14.0 | 13.5 | 15 | 14.5 |
| $B_2O_3$ | 17 | 11.7 | 17 | 17 | 15.6 | 15.6 | 17 | 17 | 17 | 18.7 | 20.4 | 22.0 | 17 | 18.7 |
| BaO | 6 | 6.7 | 6 | 10 | 6.9 | 6.9 | 6 | 6 | 6 | 5.8 | 5.6 | 5.4 | 6 | 5.8 |
| MgO | 57 | 52.5 | 62 | 57 | 54.3 | 54.3 | 59 | 61 | 58 | 55.1 | 53.1 | 51.2 | 57 | 55.1 |
| $ZrO_2$ | 2.5 | 2.0 | 0.6 | 0.6 | 1.6 | 1.6 | 1.6 | 1.6 | 2.2 | 2.4 | 2.3 | 2.3 | 2.5 | 2.4 |
| $P_2O_5$ | 2 | 0.4 | 0.4 | 0.4 | 0.4 | 0.4 | 2.4 | 2.1 | 2.1 | 1.9 | 1.9 | 1.8 | 2.0 | 1.9 |
| $Li_2O$ | 0.5 | 0.5 | 0.5 | 0.5 | 0.5 | 0.5 | 0.5 | 0.5 | 0.3 | 1.6 | 2.7 | 3.8 | — | — |
| CaO | — | 2.9 | — | — | — | — | — | — | — | — | — | — | — | — |
| CuO | — | 1.1 | — | — | — | — | — | — | — | — | — | — | — | — |
| ZnO | — | — | — | — | 3.0 | — | — | — | — | — | — | — | — | — |
| SrO | — | — | — | — | — | 3.0 | — | — | — | — | — | — | — | — |
| $Na_2O$ | — | — | — | — | — | — | — | — | — | — | — | — | 0.5 | — |
| $K_2O$ | — | — | — | — | — | — | — | — | — | — | — | — | — | 1.6 |

TABLE 2

| | Glass composition in mole % | | |
|---|---|---|---|
| Ex # | 15 | 16 | 17 |
| $SiO_2$ | 14.5 | 15 | 15 |
| $B_2O_3$ | 16.5 | 17 | 17 |
| BaO | 5.8 | 6 | 6 |

TABLE 2-continued

| | Glass composition in mole % | | |
|---|---|---|---|
| Ex # | 15 | 16 | 17 |
| MgO | 55.2 | 51 | 48 |
| $ZrO_2$ | 2.5 | 2.5 | 2.5 |
| $P_2O_5$ | 2 | 2 | 2 |
| $Li_2O$ | 0.5 | 0.5 | 0.5 |
| $TiO_2$ | 3 | 6 | 9 |

TABLE 3

| Ex. # | 18 | 19 | 20 | 21 | 22 | 23 | 24 | 25 | 26 | 27 | 28 |
|---|---|---|---|---|---|---|---|---|---|---|---|
| Glass Ex. # | 1 | 1 | 1 | 1 | 3 | 4 | 5 | 7 | 10 | 12 | 13 |
| Ceramic tape composition in wt % based on solids | | | | | | | | | | | |
| Glass | 81.3 | 72.4 | 49.6 | 89.3 | 79.6 | 89.6 | 94.5 | 78.4 | 81.3 | 81.3 | 81.3 |
| $Al_2O_3$ | 17.9 | 26.8 | 49.6 | 9.9 | 19.9 | 9.9 | 5.0 | 19.6 | 17.9 | 17.9 | 17.9 |
| $Cu_2O$ | 0.5 | 0.5 | 0.5 | 0.5 | 0.5 | 0.5 | 0.5 | 1.5 | 0.5 | 0.5 | 0.5 |
| $Fe_2O_3$ | 0.3 | 0.3 | 0.3 | 0.3 | — | — | — | 0.5 | 0.3 | 0.3 | 0.3 |
| Tape characteristics | | | | | | | | | | | |
| TCE (ppm/° C.) | 11.0 | 10.6 | 9.7 | 11.3 | 11.3 | 11.1 | 11.4 | 11.0 | — | — | — |
| Dielectric constant | 8.2 | 8.0 | 7.7 | 8.4 | 8.3 | 8.2 | 8.7 | 8.1 | 8.0 | 8.3 | 8.2 |
| Fired x,y shrinkage (%) | 14.3 | 13.6 | 7.4 | 14.5 | 15.7 | — | 22.3 | — | 15.9 | 15.4 | 14.6 |

Examples 15–17

Examples 15–17 as shown in Table 2 denote glass compositions of the present invention, which contains particularly $TiO_2$ in glass. Glasses are prepared according to the same glass making techniques as described for glasses in Table 1. The $TiO_2$ incorporation is believed to give high dielectric constant, which is desirable for BGA applications operating at high frequencies. The high dielectric constant can contribute to the smaller device or module size.

Examples 18–28

Table 3 demonstrates some examples of tape compositions containing glasses in Table 1. Tape was prepared using various ratios of glass/alumina filler until the point of full densification was achieved yet without excessive glass to keep TCE reasonably high in the temperature range of 25° C. to 300° C. Tape was prepared by dispersing powders of glass and alumina oxide in an ethylacetate solvent with methylmethacrylate, methacrylic acid copolymer binder and plasticizer. In addition, coloring agent such as $Fe_2O_3$ and/or $Cu_2O$ was added to the tape slurry. In particular, $Cu_2O$ acts as a diffusion barrier against silver migration from Ag-based conductors.

The slip was cast on a Mylar sheet and dried to form a tape. The tape was cut, laminated, printed with thick film silver and fired in a conventional profile with an 850° C./10 min peak. The ceramic fired dense with a high x, y shrinkage and showed no stains with co-fired silvers. The co-fired silvers and palladium-silver showed good wetting of conventional solder. The final tape also showed good dimensional stability and no distortion or cracks along the pattern of co-fired Ag or Pd/Ag. This is a huge benefit which can be used for the stand alone LTCC application.

Table 3 also shows the characteristics of resulting tapes fired at 850° C. for 30 min in a conveyor furnace. Temperature coefficient of expansion depended on the glass composition and the content of alumina filler. The TCE values were between 9 and 12 ppm° C.$^{-1}$ regardless of given compositions in Table 3. Low frequency dielectric characteristics were evaluated using an impedance analyzer (Hewlett Packard 4192A) within the frequency range of 1 kHz to 13 MHz. Dielectric constants given in Table 3 were measured at 1 MHz. No significant variation in the dielectric constant was observed although the value varied slightly according to glass composition and alumina content.

The shrinkage value of fired tapes seen in Table 3 indicates the sinterability of the given tape composition. For better mechanical strength and hermeticity, sufficient densification is required. The excessive addition of alumina filler was found detrimental to the final tape densification. Alumina filler more than 30 wt. % should be avoided for sufficient densification.

Examples 29–31

In Examples 29–31 the ceramic green tape was prepared by mixing the glass in Example 1 with other fillers such as $TiO_2$ and $ZrO_2$. All tapes were fired at 850° C. in the same conveyor furnace. All tape compositions showed good solderability and compatibility with co-fired Pd/Ag conductors. Dielectric constant tended to increase with increasing $TiO_2$ filler, while no substantial increase in dielectric constant was observed with $ZrO_2$ filler. The increased dielectric constant with $TiO_2$ is due to the high dielectric constant of $TiO_2$ itself.

| Ex. # | 29 | 30 | 31 |
|---|---|---|---|
| Glass Ex. # | 1 | 1 | 1 |
| Glass | 81.4 | 81.4 | 77.4 |
| $Al_2O_3$ | 14.9 | 8.9 | 17.9 |
| $TiO_2$ | 3.0 | 8.9 | — |
| $ZrO_2$ | — | — | 4.0 |
| $Cu_2O$ | 0.4 | 0.5 | 0.4 |
| $Fe_2O_3$ | 0.3 | 0.3 | 0.3 |
| TCE(ppm/° C.) | 11.1 | 10.9 | 10.7 |
| Dielectric constant | 9.3 | 10.7 | 8.4 |
| Fired x, y shrinkage (%) | 14.0 | 11.4 | 14.9 |

Examples 32–34

Tapes were prepared with the glasses containing $TiO_2$ in Table 2. The tapes were fired at 850° C. The results show that the incorporation of $TiO_2$ in glass increased dielectric constant. The incorporation of Ti into glass also aided densification as indicated in the increased x, y shrinkage values. It was suggested that the addition of $TiO_2$ into glass rather than into tape composition as a filler could be more effective in helping densification at the firing temperature of 850° C.

| Ex. # | 32 | 33 | 34 |
|---|---|---|---|
| Glass Ex. # | 15 | 16 | 17 |
| Glass | 81.4 | 81.4 | 81.4 |
| $Al_2O_3$ | 17.8 | 17.8 | 17.8 |
| $Cu_2O$ | 0.5 | 0.5 | 0.5 |
| $Fe_2O_3$ | 0.3 | 0.3 | 0.3 |
| TCE(ppm/° C.) | 10.6 | 10.7 | 10.9 |
| Dielectric constant | 8.8 | 9.2 | 9.9 |
| Fired x, y shrinkage (%) | 15.6 | 15.2 | 15.1 |

What is claimed is:

1. A glass composition comprising, in mole %, 10–25% $SiO_2$, 10–25% $B_2O_3$, 5–10% BaO, 40–65% MgO, 0.5–3% $ZrO_2$, 0.3–3% $P_2O_5$, and 0.2–5% $M_2O$ where M is selected from the group of alkali metal elements and mixtures thereof.

2. The composition of claim 1 wherein the alkali metal element is selected from Li, Na and K.

3. The composition of claim 1 further comprising that the glass exhibits a TCE higher than 9 ppm° $C.^{-1}$.

4. A castable dielectric composition comprising a dispersion of finely divided solids comprising, based on solids:
   (a) 50–90 wt. % glass composition of claim 1;
   (b) 10–50 wt % ceramic oxide filler;
   (c) organic polymeric binder; and
   (d) volatile organic solvent.

5. The castable dielectric composition of claim 4 wherein the ceramic oxide filler is selected from the group of $Al_2O_3$, $ZrO_2$, $TiO_2$, $BaTiO_3$ and mixtures thereof.

6. The castable dielectric composition of claim 4 wherein at least 50% of the glass and ceramic oxide filler comprise particles that greater than 1 μm.

7. The castable dielectric composition of claim 4 further comprising a coloring agent.

8. The castable dielectric composition of claim 7 wherein the coloring agent is 0.2–3 wt % of the composition.

9. The castable dielectric composition of claim 7 wherein the coloring agent is selected from $Cu_2O$, $Fe_2O$ and mixtures thereof.

10. A tape processed by casting a thin layer of the dispersion of claim 4 onto a flexible substrate, heating the cast layer to remove the volatile organic solvent.

11. The tape of claim 10 wherein the tape is separated from the substrate.

12. The tape of claim 10 wherein a Ag conductor composition is deposited on the tape.

13. The tape of claim 11 wherein a Ag conductor composition is deposited on the tape.

14. The tape of claim 10 used in a multilayer microcircuit application.

15. The tape of claim 11 used in a multilayer microcircuit application.

16. An article comprising the tape of claim 10 wherein the tape was processed to volatilize the organic polymeric binder and sinter the glass composition.

17. An article comprising the tape of claim 11 wherein the tape was processed to volatilize organic binder and sinter the glass composition.

* * * * *